United States Patent [19]

Nishimura et al.

[11] Patent Number: 4,695,403
[45] Date of Patent: Sep. 22, 1987

[54] THICK FILM CONDUCTOR COMPOSITION

[75] Inventors: Tsutomu Nishimura, Uji; Seiichi Nakatani, Neyagawa; Satoru Yuhaku, Osaka; Toru Ishida, Hirakata, all of Japan

[73] Assignee: Matsushita Electric Industrial Co., Ltd., Osaka, Japan

[21] Appl. No.: 875,083

[22] Filed: Jun. 17, 1986

[30] Foreign Application Priority Data

| Jun. 17, 1985 | [JP] | Japan | 60-131104 |
| Jun. 18, 1985 | [JP] | Japan | 60-132290 |
| Jun. 20, 1985 | [JP] | Japan | 60-134542 |
| Jun. 20, 1985 | [JP] | Japan | 60-134547 |

[51] Int. Cl.$^4$ .............................. H01B 1/00
[52] U.S. Cl. .................... 252/513; 252/514; 252/518; 106/1.15
[58] Field of Search .............. 252/513, 514, 518, 521; 106/1.15, 1.22

[56] References Cited

U.S. PATENT DOCUMENTS

| 2,993,815 | 7/1961 | Treptow | 252/518 |
| 3,647,532 | 3/1972 | Friedman et al. | 428/901 |
| 4,070,518 | 1/1978 | Hoffman | 428/901 |
| 4,172,919 | 10/1979 | Mitchell | 252/512 |
| 4,514,321 | 4/1985 | Siuta | 252/514 |
| 4,521,329 | 6/1985 | Suita et al. | 252/518 |
| 4,594,181 | 6/1986 | Suita | 252/518 |

FOREIGN PATENT DOCUMENTS

| 129866 | 11/1978 | Japan . |
| 128899 | 10/1980 | Japan . |
| 2398 | 1/1984 | Japan . |

Primary Examiner—Joseph L. Barr
Attorney, Agent, or Firm—Wenderoth, Lind & Ponack

[57] ABSTRACT

A thick film conductor composition for a ceramic wiring substrate comprises an inorganic ingredient mainly composed of a copper oxide powder added with a metal capable of forming a homogeneous solid solution with copper, and an organic vehicle. The inorganic ingredient may be further added with a manganese oxide or a heat resistant insulating material such as ceramics and/or glass.

13 Claims, 7 Drawing Figures

THICK FILM CONDUCTOR COMPOSITION

BACKGROUND OF THE INVENTION

1. Field of the Invention

This invention concerns a thick film conductor composition for a ceramic wiring substrate which is used as a high-density circuit mounting board for IC, LSI, chip components and the likes.

2. Description of the Prior Art

Noble metals such as Au, Au-Pt, Ag-Pt and Ag-Pd, or high melting point base metals such as W, Mo and Mo-Mn have generally been used as metals for conductor pastes used in ceramic wiring substrates.

The paste made of noble metals such as Au, Au-Pt, Ag-Pt and Ag-Pd can be fired in air but they have a drawback of expensive cost. While on the other hand, the paste made of high melting point base metals such as W, Mo and Mo-Mn can be formed into a multilayer structure since they are co-fired at a temperature of about 1600° C., that is, a temperature higher than the sintering temperature of a green sheet (about 1500° C.), but they show lower electric conductivity as compared with Au, Ag and Cu, and are required to be sintered at a high temperature in a hydrogen atmosphere, which is dangerous and needs an increased installation cost. Further, these high melting point base metals also involve a problem of requiring surface coating of Ni or Au to the conductor since they cannot be soldered.

In view of the above, Cu-metallized wiring substrates have being attracting attention at present, which are inexpensive, low in conductor resistance, free from migration and satisfactory in solderability. An Example method of manufacturing the Cu-metallized wiring substrate will be described. In the conventional method, a Cu paste is used as the material for a conductor layer. The Cu paste is screen-printed on a sintered substrate made of such as alumina to form a wiring pattern, and then dried. Then, the paste is fired at a temperature lower than the melting point of Cu (1083° C.) in a nitrogen atmosphere where the oxygen partial pressure is controlled in a delicate manner such that Cu does not suffer from oxidation while the organic ingredient in the conductor paste is burnt out adequately. In the case of preparing a multilayer structure, an insulation paste and the Cu paste are further used, for which printing, drying and firing in a neutral atmosphere are repeated desired times.

The Cu paste as described above is prepared by adding an organic ingredient composed of an organic binder, a plasticizer, a solvent, etc. to the inorganic ingredient mainly composed of fine Cu powder and mixing these into an appropriate viscosity. U.S. Pat. No. 2,993,815 (Treptow) discloses a Cu paste prepared by dispersing Cu and copper oxide and reduction-resistant glass frit added as the additives thereto into an organic medium. U.S. Pat. No. 3,647,532 (Friedman) discloses a paste prepared by dispersing Cu mixed with lead borosilicate glass frit containing cadmium oxide as the additive in an organic polymeric binder. This paste is fired at 820°-850° C. in a non-oxidizing atmosphere to form a conductor layer. Further, U.S. Pat. No. 4,070,518 (Hoffman) discloses a conductor paste for use, particularly, on a dielectric substrate. This paste comprises 85 to 97 wt% of Cu powder and 3 to 15 wt% of Cd- and Bi-free lead aluminoborate glass frit dispersed in an organic medium. U.S. Pat. No. 4,172,919 (Mitchell) discloses a conductor composition prepared by dispersing 86 to 97 wt% of Cu powder, 1 to 7 wt% of CuO and 1 to 7 wt% of glass frit containing at least 75% $B_2O_3$ into 10 to 30 wt% of inert organic medium. U.S. Pat. No. 4,514,321 (Vincent P. Sivta) discloses a paste prepared by dispersing a Cu powder mixed with an inorganic binder and 0.2 to 5 wt% of non-copper metal into an organic solvent. The non-copper metal is selected from the group consisting of tungsten, molybdenum, rhenium and an alloy or a mixture thereof. Japanese Patent Publication No. 59-2398 discloses a thick film conductor composition comprising 65 to 90 wt% of inorganic ingredient composed of 86 to 99 wt% of Cu powder, 0.3 to 12 wt% of CuO powder, 0 to 12 wt% of PbO and 0 to 12 wt% of $Bi_2O_3$ and 10 to 35 wt% of organic vehicle added thereto. These Cu conductor pastes as described above are used for microcircuits. However, in the case of using these Cu pastes, there are significant several problems regarding the method of manufacturing them.

At first, it is very difficult to control the atmosphere of the furnace to such an oxygen partial pressure that Cu does not suffer from oxidation and the organic ingredient contained in the Cu paste can completely be burnt out in the firing step. If the oxygen partial pressure is high, the Cu surface is oxidized to worsen the solderability and it also leads to reduction in the electric conductivity. While on the other hand, if the oxygen partial pressure is low, favorable adhesion cannot be obtained for the Cu metallization, and it is difficult to use the organic ingredient contained in the Cu paste. That is, the organic binder and the like used for the vehicle of the paste cannot completely be burnt (or eliminated). It is said that the organic binder does not decompose, particularly, at a temperature lower than the melting point of Cu (1083° C.). It has been known that polyvinyl butyral often used is not easily burnt completely in a non-oxidizing atmosphere at a lower temperature than 1150° C. Particularly, in the case of manufacturing a copper multilayer ceramic substrate, in which a glass-ceramic material is used as the insulation layer, it is necessary that the glass-ceramic material remains porous until all of the binder residues are removed upon the burn-out step. In the case of using the glass-ceramic and copper, the maximum temperature for removing the binder is much lower than about 800° C.-875° C. at which fine glass particles are fused. That is, if the glass particles are fused, the residual binder is captured in the glassy material. It has also been known that nitrogen or any other neutral or reducing atmosphere makes the burn-out, or the binder removing difficult at a temperature lower than the glass fusing temperature. As a result, black or blacky substrate not sintered completely are obtained. The color is generally due to carbon residues, which may result in the degradation of the insulation property (refer to Japanese Laid-Open Patent Application No. 55-128899).

Further, in the case of using metal Cu, since the metal Cu is oxidized into a copper oxide thereby causing volume expansion in the burn-out step (even if the Cu firing step is separated from the burn-out step), problems such as exfoliation of the conductor layer from the substrate are resulted. Furthermore, since the firing for the conductor layer and the insulation layer are repeated to form the multilayers, the respective layers are exposed to high temperature again and again to undergo damages. The increased number of steps increase the lead time thus resulting in the increased cost of the manufacturing installation.

While on the other hand, for attaining the complete binder removal, Japanese Laid-open Patent Application No. 53-129866 discloses a method of manufacturing a ceramic substrate capable of sufficiently removing the binder, which method comprises alternately printing a copper oxide paste and a dielectric paste comprising ceramics capable of sintering at a temperature lower than the melting point of Cu as the dielectric material to form a not-sintered ceramic substrate, provisionally firing the not-sintered material in the air atmosphere, and then firing same at 950° C. in a reducing atmosphere. According to this method, the binder can be removed completely, control for the atmosphere during firing is facilitated and the co-firing is possible for the conductor layer and the dielectric layer. However, this method also involves a significant problem regarding the conductor paste. If the inorganic ingredient of the conductor paste comprises 100% CuO, since Cu has poor wettability with the ceramic substrate in the reducing atmosphere, favorable adhesion property cannot be obtained with respect to the substrate to result in the exfoliation of the conductor from the substrate. Further, when CuO is reduced into metal Cu, it causes a volume change (shrinkage), which results in disconnection between the upper and lower layer conductors.

SUMMARY OF THE INVENTION

An object of this invention is to provide a thick film conductor composition capable of manufacturing a high performance ceramic wiring substrate using Cu as the conductor material, thereby enabling to obtain a ceramic wiring substrate which is inexpensive and highly reliable in the metallizing property.

In order to attain this object, a thick film conductor composition according to this invention comprises: an inorganic ingredient mainly composed of a copper oxide powder added with a metal capable of forming a homogenous solid solution with copper; and an organic vehicle. The inorganic ingredient may be further added with a manganese oxide or a heat resistant insulating material.

DESCRIPTION OF THE PREFERRED EMBODIMENTS

Figure 1:
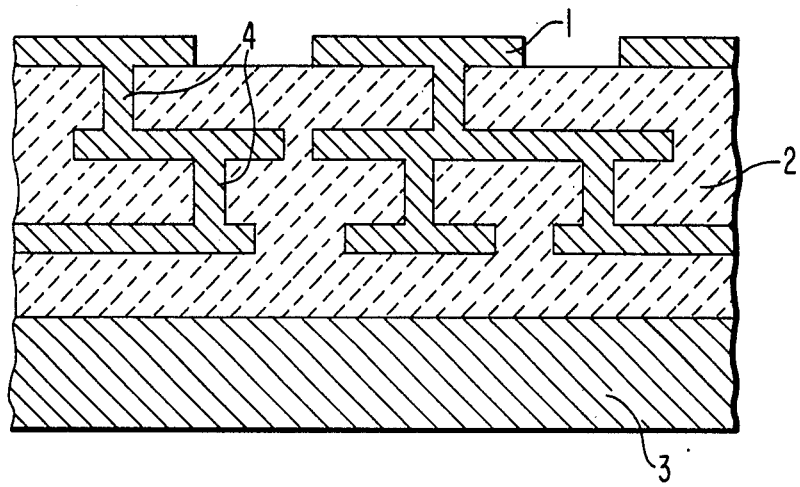
FIG. 1 is a cross sectional view showing an embodiment of a copper multilayer ceramic substrate manufactured by using a film conductor composition according to this invention.

FIG. 1 shows a cross sectional view of an embodiment of copper multilayer ceramic wiring substrate manufactured by using a thick film conductor composition according to this invention, in which are shown a Cu-metallized layer 1 obtained by the thick film conductor composition according to this invention, an insulation layer 2, via holes 4 and a sintered 96% alumina substrate 3.

There are two methods for obtaining the copper multilayer ceramic substrate shown in FIG. 1. In the first method, a thick film conductor composition comprising Cu powder as the main ingredient is used. In this case, the conductor layer is printed by means of a screen-printing process or the like onto a sintered alumina substrate or the like, dried and then fired at a temperature of about 900° C. in a nitrogen atmosphere where the oxygen partial pressure is controlled in a delicate manner. Further, in order to obtain a multilayer structure, the above printing, drying and firing steps are repeated for the respective insulating layers and conductor layers to obtain a desired number of layers.

In the second method, a thick film conductor composition comprising copper oxide as the main ingredient is used. In this case, the conductor layer is printed and dried in the same manner as in the first method by means of a screen-printing process or the like. Then, printing and drying steps are repeated until desired number of layers are obtained such that printing and drying are performed for the respective insulation layers and conductor layers. Then, this not-yet-sintered substrate is heat-treated in air, reduced in a mixed atmosphere of nitrogen and hydrogen, and thereafter sintered in a nitrogen atmosphere.

It is required for the thick film conductor composition for use in the copper multilayer ceramic wiring substrate to obtain a superior metallizing property between the sintered alumina substrate and the insulation layer, and to suppress the volume shrinkage in the reducing and sintering steps thereby causing neither the exfoliation nor the cracks in the conductor layer. The thick film conductor composition according to this invention is made by adding an organic vehicle to an inorganic ingredient prepared by adding, to a copper oxide powder, a metal capable of forming a homogenous solid solution with copper and, further, a manganese oxide and at least one of heat resistant insulation materials such as glass and/or ceramics.

As the copper oxide used as the main ingredient, CuO causing neither volume change due to crystal transformation nor unnecessary diffusion in a temperature range during burn-out is used. CuO is very stable in the air. $Cu_2O$ may also be mentioned as a copper oxide other than CuO. It is said that although $Cu_2O$ shows volume change due to the transformation into CuO in the course of temperature rise in air, it remains in the form of $Cu_2O$ as it is within the oxygen partial pressure $PO_2$ from $10^{-3}$ to $10^{-5}$, by which the heat decomposition of the organic binder is possible. However, since the oxygen partial pressure has to be controlled in the manner as described above, it is not so suitable for the thick film conductor composition according to this invention.

Addition of manganese oxide and heat resistant insulation material such as glass and/or ceramics provides a significant effect for improving the metallizing property. The manganese oxide is stable even in the reducing atmosphere and reacts with CuO to improve the adhesiveness to the insulation layer and the sintered alumina substrate. Further, the heat resistant insulation material must be thermo dynamically stable even in the reducing atmosphere and should not cause oxidizing or reducing reaction with CuO. In view of this, it is desired that the heat resistant insulation material has a composition selected from BaO, $B_2O_3$, CaO, MgO, $Al_2O_3$ and $SiO_2$. Further, the addition of both of the manganese oxide and the heat resistant insulation material is extremely effective. Since both of the materials are stable in the reducing atmosphere there is no possibility that they give undesired influence on each other. By the additives as described above, a favorable metallizing property can be obtained in the conductor layer.

Next, description will be made for the method of retaining the volume shrinkage in the reduction and firing steps thereby avoiding the exfoliation or cracks in the conductor layer.

It is extremely effective to add a metal capable of forming a homogenous solid solution with copper to the copper oxide. The addition of Pt, Pd and Ni is particularly effective, because it is necessary that the metal as the additives does not cause volume shrinkage during the reduction step in order to retain the volume shrinkage in the conductor layer. In order to satisfy this requirement, it is necessary that the additives are kept to be present as the metal in the burn-out step prior to the reduction step. However, it should be avoided that the metal of the additive forms an alloy with Cu in the following firing step and that the melting point of the alloy is lower than the sintering temperature. On considering these, the metal capable of satisfying the above conditions is Pt, Pd or Ni. Although Ni forms an oxide, NiO, it gives no effect of the volumic change at the burn-out temperature but only the surface is oxidized slightly.

The manganese oxide and the heat resistant insulation material added for improving the adhesion strength and Pt, Pd and Ni added for retaining the shrinkage can be used simultaneously. The respective effects will not be offset with each other by the simultaneous addition.

EXAMPLE 1

A sintered substrate comprising 96% alumina was used as the material for the ceramic substrate. Further, a thick film conductor composition was prepared by using CuO powder as the main ingredient and Pt, Pd and Ni powders as the additives and by further adding an organic vehicle to form a paste. For preparing the paste, a vehicle composition using turpentine oil as a solvent and ethylcellulose as an organic binder dissolved therein was kneaded with the powder mixture in a 3-stage roll into a paste. A copper ceramic wiring substrate was manufactured by using the thus prepared paste and evaluated for the adhesion strength, solderability and cracks or pits in the via hole portion due to the shrinkage under firing.

The method of manufacturing the ceramic wiring substrate will be described below. At first, an insulation paste was printed on the sintered 96% alumina substrate through 200 mesh stainless steel screen to a thickness of about 30 μm, and then dried at 120° C. for 10 minutes. The insulation paste used herein was composed of borosilicate glass powder (#7059: manufactured by Corning Co.) and alumina powder blended together at 1:1 weight ratio as the inorganic ingredient. The mixture was further kneaded with the same vehicle as that used in the conductor paste into an appropriate viscosity. After drying the insulation paste, the conductor paste was printed by using a 250 mesh stainless steel screen to a thickness of 20 μm, and then dried in the same manner as above. The conductor layer had a thickness of at least 10 μm after the drying. For preparing the conductor paste and the insulation paste, turpentine oil was used as the solvent and ethylcellulose was used as the organic binder. Nitrocellulose may be used instead of ethylcellulose as the organic binder. Butylcarbitol or cellosolves such as butylcellosolve may be used instead of nitrocellulose as the solvent. Furthermore, the use of a surface active agent such as sorbitan alkyl ester and a polyoxethylene alkyl ether is also effective. Then, a binder was removed from the substrate thus prepared and dried in air at a temperature of about 700° C. The temperature profile upon the binder removal (burn-out) is shown by the zone 1 in FIG. 7. Under this condition, most of the organic binder could be heat-decomposed, by which the organic ingredient could be eliminated completely.

The temperature and the atmosphere used for the burn-out were set after previously carrying out thermal analysis to confirm whether the binder has been removed completely or not. Accordingly, the setting temperature for the burn-out naturally varies depending on the kinds of binders since the decomposing temperature somewhat varies based thereon. When the surface of the substrate after the burn-out was observed under a scanning electron microscope, it was confirmed that only the organic binder was removed with no change in the particle size of the inorganic material in the insulation layer and no softening in the glass ingredient. This means that the binder has been removed at a temperature lower than the softening point of the glass ingredient.

Then, the substrate after the burn-out was subjected to reduction. This condition is shown by the zone 2 in FIG. 7. The reduction was carried out in a nitrogen gas atmosphere containing 10% hydrogen gas (2 liter/min flow rate). When carrying out the reduction for about one hour at a temperature of 200° C., 300° C. and 400° C. respectively, reduction of CuO into Cu did not occur at 200° C., but occurred at a temperature of 300° C. or 400° C. It was thus found desirable to carry out the reduction at a temperature between 300°–400° C. in the case of using CuO.

Figure 2:
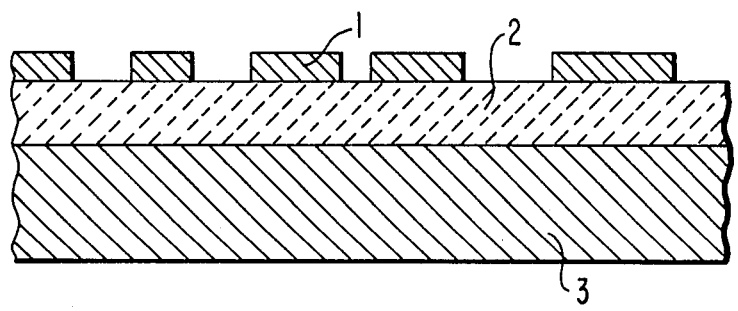
FIG. 2 is a cross sectional view showing a substrate for measuring adhesion strength and solderability manufactured by using the thick film conductor composition according to this invention.
Figure 7:
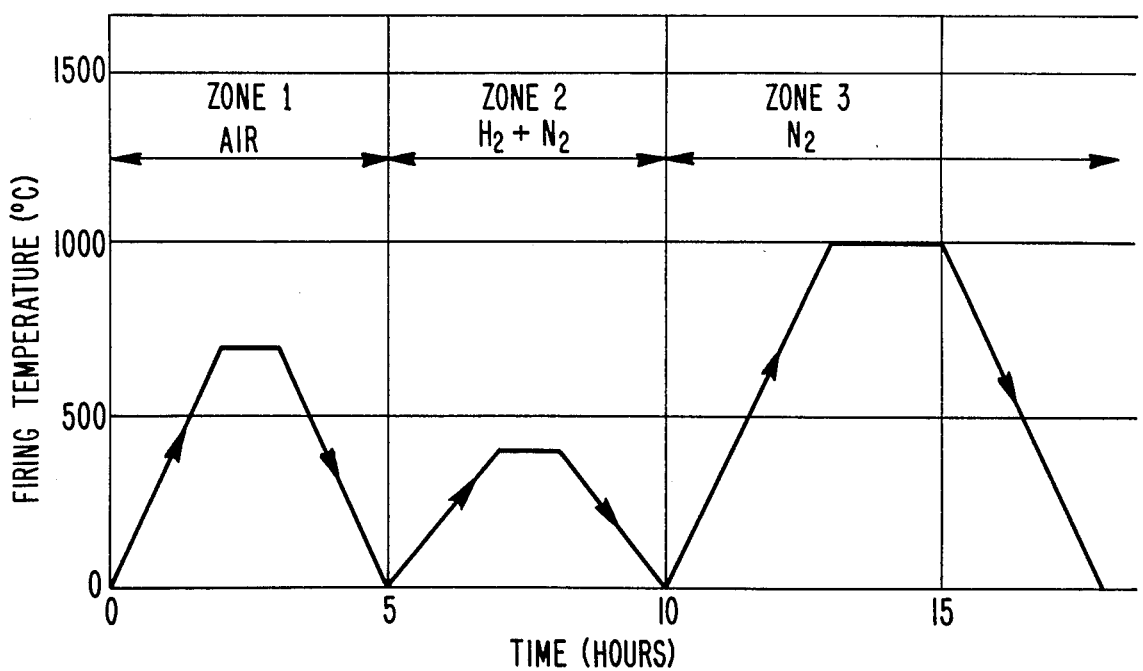
FIG. 7 is a chart showing one example for temperature and atmospherre profiles in burn-out, step reduction and sintering steps for manufacturing a copper multilayer ceramic substrate by using the thick film conductor composition according to this invention.

Then, firing was carried out along the profile shown by the zone 3 in FIG. 7. FIG. 2 shows a cross sectional view of the copper ceramic wiring substrate thus prepared.

Then, adhesion strength and solderability were measured for the substrate. The solderability was judged qualitatively for the wettability when the substrate was dipped into a solder dipping vessel. "Excellent" and "favorable" show a practical range. The adhesion strength was judged by soldering a lead wire of 0.8 mm φ vertically to the substrate at 2 mm square pattern and by measuring the bonding strength between the substrate and the wirings by using a tensile tester. The solder used herein was comprised of 62% Sn, 36% Pb and 2% Ag. The composition for the conductor paste, and the results for the adhesion strength and solderability are shown in Table 1.

Figure 4:
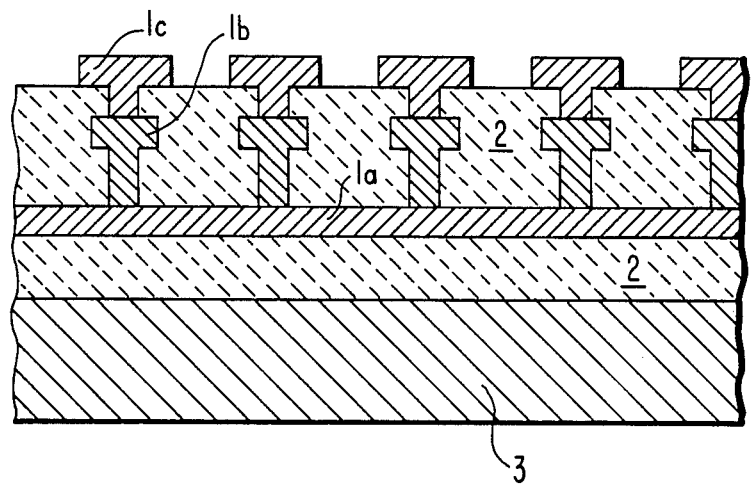
FIG. 4 is a cross sectional view showing a substrate for evaluating cracks and pits in the conductor layer due to shrinkage.
Figure 6:
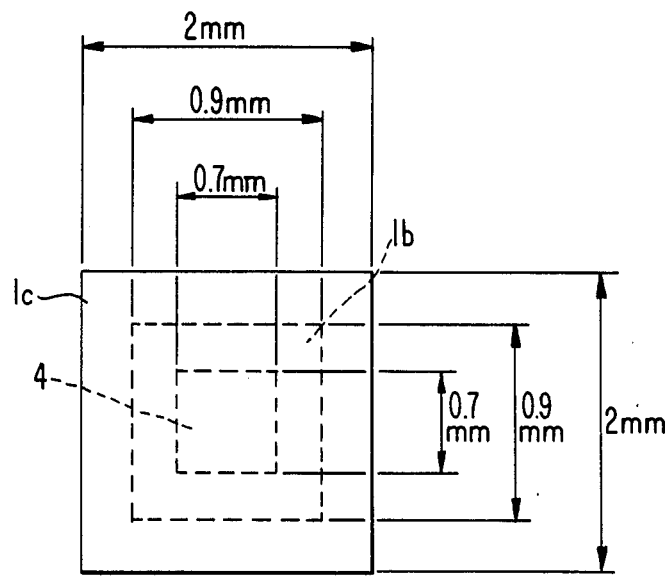
FIG. 6 is a top view of the upper layer pattern of the substrate shown in FIGS. 4 and 5.

Then, a wiring substrate of a cross section shown in FIG. 4 was manufactured. In FIG. 4, conductor layers are constructed by an inorganic ingredient layer 1a of 100% CuO paste, a thick film conductor layer 1b according to the invention, and a commercially available Cu paste layer 1c. At first, an insulation layer was printed on a sintered 96% alumina substrate followed by drying and then a conductor paste comprising the inorganic ingredient composed of 100 wt% CuO was printed to via hole portions followed by drying and, finally, an insulation layer was printed again. The composition for the insulation paste and the conditions for the printing, drying, burn-out, reduction and firing were the same as those employed for manufacturing the wiring substrate previously described. After the sintering, a Cu paste (#9153: manufactured by Du Pont) was printed, dried (10 minutes at 110° C.) and then fired in a belt furnace at 900° C. The thus manufactured wiring substrate was evaluated for the cracks or pits formed in the via hole portions due to the shrinkage upon firing. The evaluation was carried out by disposing the pattern as shown in FIG. 6 at 100 sites on the substrate and counting the number of upper layer patterns in which cracks or pits were observed. The results thus obtained are also shown in Table 1.

TABLE 1

| Additives | | | | | Number of pattern showing cracks, pits in the via hole (N/100) |
|---|---|---|---|---|---|
| Name | Amount (Wt %) | CuO (Wt %) | Solder-ability | Adhesion strength (Kg/mm$^2$) | |
| none | 0 | 100 | excellent | 1.20 | 98 |
| Pt | 1 | 99 | excellent | 1.24 | 91 |
|  | 2 | 98 | excellent | 1.79 | 84 |
|  | 5 | 95 | favorable | 1.86 | 71 |
|  | 10 | 90 | moderate | measure- | 20 |
|  | 15 | 85 | moderate | ment | 12 |
|  | 20 | 80 | moderate | im- | 0 |
|  | 25 | 75 | moderate | possible | 0 |
| Pd | 1 | 99 | excellent | 1.17 | 92 |
|  | 2 | 98 | excellent | 1.71 | 89 |
|  | 5 | 95 | favorable | 1.70 | 75 |
|  | 10 | 90 | moderate | measure- | 27 |
|  | 15 | 85 | moderate | ment | 23 |
|  | 20 | 80 | moderate | im- | 0 |
|  | 25 | 75 | moderate | possible | 0 |
| Ni | 1 | 99 | excellent | 1.22 | 95 |
|  | 2 | 98 | excellent | 1.57 | 93 |
|  | 5 | 95 | favorable | 1.61 | 79 |
|  | 10 | 90 | moderate | measure- | 31 |
|  | 15 | 85 | moderate | ment | 22 |
|  | 20 | 80 | moderate | im-possible | 13 |
|  | 25 | 75 | measurement impossible | possible | measurement impossible |

As can be seen from Table 1, the solderability was extremely worsened if the amount of each of the additives exceeded 10 wt%. For the adhesion strength, no substantial effect of the additives was observed with 1 wt% addition, while remarkable effect was observed by 2 or 5 wt% addition. Measurement was impossible for the adhesion strength with the additives in excess of 10 wt% due to the effect of the soldering. Referring to the cracks or pits in the via holes, no remarkable improvement was obtained by the additives for 1, 2 and 5 wt% of addition amount, whereas remarkable improvement was recognized by the addition of at least 10 wt%. Data for adding 25 wt% Ni powder are not shown, because Ni caused exfoliation due to the volume expansion as it was oxidized into NiO in the burn-out step and due to the volume change as it was reduced to Ni again in the firing step. However, no exfoliation occurred in the case of 1–20 wt% of addition. However addition of the Ni powder generally showed lower adhesion strength and more frequent occurrence of cracks or pits as compared with other additives, possibly because of the effect due to the volume change although not leading to the exfoliation. From the foregoing results, addition of the Pt, Pd and Ni powder within a range from 2 to 5 wt% is particularly effective for the conductor paste for use in the ceramic wiring substrate to obtain the improved adhesion strength.

Further, the addition amount exceeding 10 wt% is effective for the conductor paste used for filling the via holes where the solderability needs no to be so high, because it lowers the shrinkage and provides a dense structure although the solderability is poor. Usually, in the case of the ceramic multilayer wiring substrate, via holes are disposed to the insulation layer for providing the electrical conduction between the inner layer and outer layer conductors. However, it becomes difficult to fill the via holes with the conductor by the printing of the upper layer, because the shrinkage in the conductor at the via hole portions in the firing step causes cracks or pits in the upper layer and the disconnection with the inner layer conductor. In view of the above, although a layer of pattern is disposed for the via hole portions, use of a conductor paste at a higher shrinkage can provide no effective countermeasure since this also results in the cracks, pits and disconnecton at a high frequency due to firing. Therefore, it is effective to retain the shrinkage by the additives as in this invention. Although the increase in the conductor resistance may be considered with the increase in the addition amount, no substantial effect is resulted to the entire wiring pattern in the case of using them only for the via hole portions where the resistance along the thickness is considered.

EXAMPLE 2

The CuO, Pt, Pd and Ni powders shown in Example 1 respectively are further added with a heat resistant insulation material. Glass powder was used as the heat resistant insulation material. The glass powder was manufactured by mixing BaO, B$_2$O$_3$, SiO$_2$, Al$_2$O$_3$, CaO and MgO respectively in the form of BaCO$_3$, SiO$_2$, Al$_2$O$_3$, CaCO$_3$ and MgO at 30, 50, 5, 10, 2.5 and 2.5 weight ratio respectively, melting them at a temperature of 1250° C., pouring them into water to quench, drying and then wet-pulverizing the thus obtained glass particle. Pulverization was carried out with alumina balls for 72 hours using methyl alcohol as the solvent. As a result, glass powder of 2 μm in average particle size could be prepared. Measurement was carried out in the same manner as in Example 1 for the thus prepared conductor paste. The results are shown in Table 2.

TABLE 2

| Additives | Amount (wt %) | Additives | Amount (wt %) | CuO (wt %) | Solderability | Adhesion strength (Kg/mm$^2$) | Number of pattern showing cracks, pits in the via hole (N/100) |
|---|---|---|---|---|---|---|---|
| none | 0 | none | 0 | 100 | excellent | 1.20 | 98 |
| Pt | 2 | Glass | 1 | 97 | excellent | 1.76 | 85 |

TABLE 2-continued

| Additives | Amount (wt %) | Additives | Amount (wt %) | CuO (wt %) | Solderability | Adhesion strength (Kg/mm²) | Number of pattern showing cracks, pits in the via hole (N/100) |
|---|---|---|---|---|---|---|---|
| | | | | 2 | 96 | excellent | 1.92 | 83 |
| | | | | 5 | 93 | excellent | 1.95 | 81 |
| | | | | 10 | 88 | favorable | 1.83 | 71 |
| | | | | 15 | 83 | moderate | measurement impossible | 66 |
| | | 15 | Glass | 1 | 84 | moderate | measurement impossible | 10 |
| | | | | 2 | 83 | | | 11 |
| | | | | 5 | 80 | | | 9 |
| | | | | 10 | 75 | | | 4 |
| | | | | 15 | 70 | | | 1 |
| Pd | 2 | Glass | | 1 | 97 | excellent | 1.70 | 87 |
| | | | | 2 | 96 | excellent | 1.82 | 80 |
| | | | | 5 | 93 | excellent | 1.88 | 75 |
| | | | | 10 | 88 | favorable | 1.91 | 72 |
| | | | | 15 | 83 | moderate | measurement impossible | 60 |
| | | 15 | Glass | 1 | 84 | moderate | measurement impossible | 23 |
| | | | | 2 | 83 | | | 16 |
| | | | | 5 | 80 | | | 11 |
| | | | | 10 | 75 | | | 5 |
| | | | | 15 | 70 | | | 3 |
| Ni | 2 | Glass | | 1 | 97 | excellent | 1.59 | 90 |
| | | | | 2 | 96 | excellent | 1.77 | 87 |
| | | | | 5 | 93 | excellent | 1.81 | 81 |
| | | | | 10 | 88 | moderate | 1.86 | 76 |
| | | | | 15 | 83 | moderate | measurement impossible | 70 |
| | | 15 | Glass | 1 | 84 | moderate | measurement impossible | 28 |
| | | | | 2 | 83 | | | 20 |
| | | | | 5 | 80 | | | |
| | | | | 10 | 75 | | | 9 |
| | | | | 15 | 70 | | | 4 |

As can be seen from Table 2, if Pt, Pd and Ni were added by 15 wt%, the adhesion strength could not be measured due to the effect of the solderability. Although the addition of the glass powder showed no substantial effect to the cracks or pits in the via hole portions, addition of the glass powder from 2 to 5 wt% was found extremely effective for the adhesion strength. While the glass ingredient of BaO, B₂O₃, CaO, MgO, Al₂O₃ and SiO₂ was used in this example, other ingredients can of course be used optionally so long as they cause no oxidation to Cu during firing in the reducing atmosphere.

EXAMPLE 3

Figure 3:
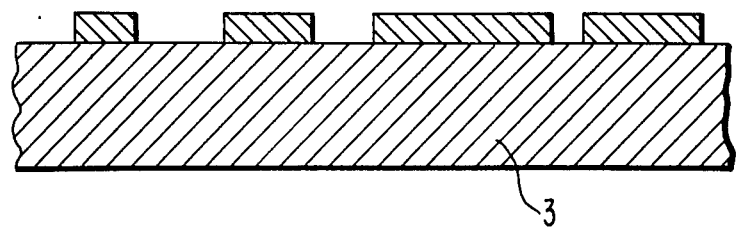
FIG. 3 is a cross sectional view showing another substrate for measuring adhesion strength and solderability manufactured by using the thick film conductor composition according to this invention.
Figure 5:
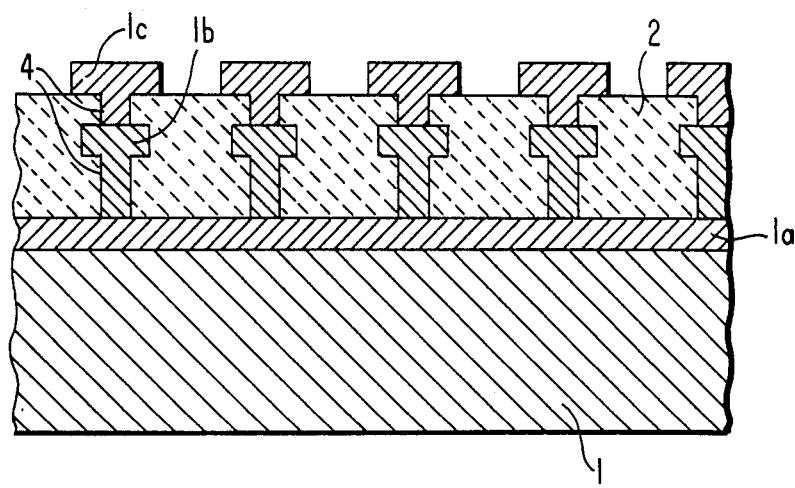
FIG. 5 is a cross sectional view showing another substrate for evaluating cracks and pits in the conductor layer due to shrinkage.

A conductor paste was prepared by using CuO, Pt, Pd and Ni powders shown in Example 1, respectively and by further adding MnO₂ powder. Then, a substrate for the measurement of the adhesion strength and the solderability, as well as a substrate for the measurement of cracks or pits in the conductor layer at the via hole portions were manufactured respectively in the same manner as in Example 1, and respective measurements were carried out. FIG. 3 shows a cross sectional view of a substrate for the measurement of the adhesion strength and the solderability used in Example 3, and FIG. 5 shows a cross sectional view of a substrate for the measurement of cracks or pits in the conductor layer. Addition effect of the MnO₂ was examined by using the test substrates described above and the results are shown in Tables 3, 4 and 5.

TABLE 3

| Additives Name | Amount (wt %) | MnO₂ amount (wt %) | CuO amount (wt %) | Solderability | Adhesion strength (Kg/mm²) | Number of pattern showing cracks, pits in the via hole (N/100) |
|---|---|---|---|---|---|---|
| none | 0 | 0 | 100 | excellent | 0.43 | 99 |
| Pt | 2 | 0 | 98 | excellent | 0.62 | 85 |
| | | 1 | 97 | excellent | 1.92 | 87 |
| | | 2 | 96 | excellent | 2.23 | 84 |
| | | 5 | 93 | excellent | 2.17 | 76 |
| | | 10 | 88 | favorable | 1.88 | 68 |
| | 5 | 0 | 95 | favorable | 0.57 | 70 |
| | | 1 | 94 | favorable | 2.05 | 71 |
| | | 2 | 93 | favorable | 2.21 | 68 |
| | | 5 | 90 | favorable | 1.84 | 59 |
| | | 10 | 85 | failed | measurement impossible | 50 |
| | 15 | 0 | 85 | failed | measurement impossible | 10 |
| | | 1 | 84 | | | 8 |
| | | 2 | 83 | | | 2 |
| | | 5 | 80 | | | 0 |

TABLE 3-continued

| Additives | | | | | Number of pattern showing cracks, pits |
|---|---|---|---|---|---|
| Name | Amount (wt %) | MnO₂ amount (wt %) | CuO amount (wt %) | Solderability | Adhesion strength (Kg/mm²) | in the via hole (N/100) |
| | | 10 | 75 | | | 0 |

TABLE 4

| Additives | | | | | | Number of pattern showing cracks, pits |
|---|---|---|---|---|---|---|
| Name | Amount (wt %) | MnO₂ amount (wt %) | CuO amount (wt %) | Solderability | Adhesion strength (Kg/mm²) | in the via hole (N/100) |
| Pd | 2 | 0 | 98 | excellent | 0.55 | 92 |
| | | 1 | 97 | excellent | 1.89 | 90 |
| | | 2 | 96 | excellent | 1.95 | 85 |
| | | 5 | 93 | excellent | 2.11 | 73 |
| | | 10 | 88 | favorable | 1.87 | 65 |
| | 5 | 0 | 95 | favorable | 0.67 | 75 |
| | | 1 | 94 | favorable | 1.79 | 73 |
| | | 2 | 93 | favorable | 1.98 | 69 |
| | | 5 | 90 | favorable | 2.04 | 58 |
| | | 10 | 85 | failed | measurement impossible | 47 |
| | 15 | 0 | 85 | failed | measurement impossible | 21 |
| | | 1 | 84 | | ″ | 19 |
| | | 2 | 83 | | ″ | 7 |
| | | 5 | 80 | | | 3 |
| | | 10 | 75 | | | 0 |

TABLE 5

| Additives | | | | | | Number of pattern showing cracks, pits |
|---|---|---|---|---|---|---|
| Name | Amount (wt %) | MnO₂ amount (wt %) | CuO amount (wt %) | Solderability | Adhesion strength (Kg/mm²) | in the via hole (N/100) |
| Ni | 2 | 0 | 98 | excellent | 0.41 | 96 |
| | | 1 | 97 | excellent | 1.80 | 90 |
| | | 2 | 96 | excellent | 1.84 | 87 |
| | | 5 | 93 | excellent | 2.03 | 80 |
| | | 10 | 88 | favorable | 1.91 | 73 |
| | 5 | 0 | 95 | excellent | 0.59 | 81 |
| | | 1 | 94 | excellent | 1.84 | 79 |
| | | 2 | 93 | excellent | 1.85 | 78 |
| | | 5 | 90 | favorable | 1.91 | 69 |
| | | 10 | 85 | favorable | 1.55 | 62 |
| | | 0 | 85 | excellent | 0.36 | 25 |
| | 15 | 0 | 85 | excellent | 0.36 | 25 |
| | | 1 | 84 | excellent | 1.51 | 24 |
| | | 2 | 83 | favorable | 1.48 | 13 |
| | | 5 | 80 | failed | measurement impossible | 8 |
| | | 10 | 75 | | | 2 |

As apparent from Tables 3, 4 and 5, addition of the MnO₂ powder shows an extremely remarkable effect to the adhesion strength in the case of adding the Pt, Pd and Ni powder by 2.5 wt%. However, the adhesion strength could not be measured due to the solderability in the case of adding the Pt and Pd powders by 5 wt% respectively and adding the MnO₂ powder by 10 wt%. In the same manner, the solderability was extremely poor and the adhesion strength could not be measured if the Pt and Pd powders were added by 15 wt% respectively, even if the MnO₂ addition amount was reduced to 0%. While on the other hand, in the case of adding the Ni powder, since Ni is solderable, measurement for the adhesion strength was possible in all of the cases other than the addition of MnO₂ by 5 and 10 wt%. Although the values for the adhesion strength were extremely lower as compared with those in the case of adding the Ni powder by 2 or 5 wt%, the effect by the addition can be recognized apparently. Taking this result into consideration together with the result for the addition of MnO₂ by 2.5 wt%, MnO₂ addition is considered effective in order to improve the inner layer strength upon direct mounting of the components to the pattern on the via holes.

Considering the foregoing results collectively, the addition of MnO₂ effective to the adhesion strength in the case of adding Pt, Pd and Ni powders by 2-5 wt% is particularly effective for the conductor paste for use in the ceramic wiring substrate. Further, in the case of adding 15 wt% of metal powder, although the powder other than the Ni powder shows poor solderability, it is effective for the conductor paste for filling the via holes where no high solerability is demanded since this lowers the shrinkage and provides a dense structure. Furthermore, since the addition of MnO₂ has an effect of suppressing the cracks or pits in the pattern on the via holes and an effect of improving the strength for the inner layer, MnO₂ is considered to be an extremely effective additive.

EXAMPLE 4

Substrates for use in measurement shown in FIGS. 3 and 5 were prepared by using an inorganic ingredient composed of CuO and $MnO_2$ powder shown in Example 3 and a heat resistant insulation material (glass powder composed of BaO, $B_2O_3$, $SiO_2$, $Al_2O_3$, CaO and MgO) further added thereto, and in the same procedures as in the examples previously described. Measurement was conducted for the adhesion strength, solderability and cracks or pits and the results are shown in Table 6. As a result, the addition of the glass powder was effective to the cracks or pits at the via hole portions, and an apparent effect was also observed for the adhesion strength. The heat resistant insulation material as the optional additive is not of course limited only to the glass powder described herein but the material of any ingredients can be used provided that they cause no oxidation to Cu during firing under the reducing atmosphere.

EXAMPLE 5

Commercially available special grade CuO was calcined at the rising/falling rate of 300° C. per hour and kept at 900° C. for 3 hours. The calcination was carried out in the surrounding atmosphere. Then, the calcined product was pulverized in methanol using a pulverizing pot for 24 hours, and CuO obtained after drying was classified such that more than 95 wt% thereof was included within a range of particle size from 1 to 9 μm. A conductor paste was prepared by using $MnO_2$ added to CuO as the inorganic ingredient under the conditions shown in Table 7. Ceramic wiring substrates were prepared by using the paste, and measurement was conducted for the adhesion strength, solderability and sheet resistivity. The substrate for the measurement was prepared in the same procedures as shown in Examples 1–4. In this example, the sheet resistivity was measured and was determined by the calculation based on the result of measuring the resistance across both ends of the conductor pattern with 300 μm width, 120 mm length and about 10 μm of film thickness using an ohm meter.

TABLE 6

| Additive | Amount (wt %) | Additive | Amount (wt %) | Additive | Amount (wt %) | CuO amount (wt %) | Solderability | Adhesion strength (Kg/mm$^2$) | Number of pattern showing cracks, pits in the via hole (N/100) |
| --- | --- | --- | --- | --- | --- | --- | --- | --- | --- |
| none | 0 | none | 0 | none | 0 | 100 | excellent | 0.41 | 97 |
| Pt | 2 | MnO$_2$ | 2 | Glass | 0 | 96 | excellent | 2.23 | 86 |
|  |  |  |  |  | 1 | 95 | excellent | 2.26 | 81 |
|  |  |  |  |  | 2 | 94 | excellent | 2.32 | 74 |
|  |  |  |  |  | 5 | 91 | excellent | 2.11 | 65 |
|  |  |  |  |  | 10 | 86 | favorable | 2.24 | 37 |
|  |  |  |  |  | 15 | 81 | moderate | measurement impossible | 20 |
|  |  |  |  | 5 | Glass | 0 | 93 | excellent | 2.17 | 84 |
|  |  |  |  |  | 1 | 92 | excellent | 2.25 | 78 |
|  |  |  |  |  | 2 | 91 | excellent | 2.36 | 70 |
|  |  |  |  |  | 5 | 88 | favorable | 2.32 | 54 |
|  |  |  |  |  | 10 | 83 | favorable | 2.21 | 34 |
|  |  |  |  |  | 15 | 78 | moderate | measurement impossible | 17 |
| Pd | 2 | MnO$_2$ | 2 | Glass | 0 | 96 | excellent | 1.95 | 89 |
|  |  |  |  |  | 1 | 95 | excellent | 2.30 | 82 |
|  |  |  |  |  | 2 | 94 | excellent | 2.41 | 78 |
|  |  |  |  |  | 5 | 91 | excellent | 2.35 | 71 |
|  |  |  |  |  | 10 | 86 | favorable | 2.20 | 47 |
|  |  |  |  |  | 15 | 81 | moderate | measurement impossible | 26 |
|  |  |  |  | 5 | Glass | 0 | 93 | excellent | 2.11 | 83 |
|  |  |  |  |  | 1 | 92 | excellent | 2.17 | 80 |
|  |  |  |  |  | 2 | 91 | excellent | 2.39 | 70 |
|  |  |  |  |  | 5 | 88 | favorable | 2.37 | 57 |
|  |  |  |  |  | 10 | 83 | favorable | 2.18 | 32 |
|  |  |  |  |  | 15 | 78 | failed | measurement impossible | 21 |
| Ni | 2 | MnO$_2$ | 2 | Glass | 0 | 96 | excellent | 1.84 | 93 |
|  |  |  |  |  | 1 | 95 | excellent | 1.99 | 86 |
|  |  |  |  |  | 2 | 94 | excellent | 2.27 | 79 |
|  |  |  |  |  | 5 | 91 | excellent | 2.30 | 68 |
|  |  |  |  |  | 10 | 86 | favorable | 2.18 | 49 |
|  |  |  |  |  | 15 | 81 | moderate | measurement impossible | 19 |
|  |  |  |  | 5 | Glass | 0 | 93 | excellent | 2.03 | 90 |
|  |  |  |  |  | 1 | 92 | excellent | 2.20 | 79 |
|  |  |  |  |  | 2 | 91 | excellent | 2.29 | 71 |
|  |  |  |  |  | 5 | 88 | favorable | 2.31 | 55 |
|  |  |  |  |  | 10 | 83 | favorable | 2.22 | 26 |
|  |  |  |  |  | 15 | 78 | moderate | measurement impossible | 15 |

TABLE 7

| Pt additives (wt %) | CuO condition | MnO₂ particle diameter | CuO amount (wt %) | MnO₂ amount (wt %) | Solderability | Adhesion strength (Kg/mm$^2$) | Sheet resistivity (mΩ/□) |
| --- | --- | --- | --- | --- | --- | --- | --- |
| 2 | 1 μm~9 μm | less than 5 μm | 98.0 | 0 | excellent | 1.79 | 3.00 |
|   |   |   | 97.0 | 1.0 | excellent | 2.58 | 2.98 |
|   |   |   | 96.5 | 1.5 | excellent | 2.85 | 3.01 |
|   |   |   | 96.0 | 2.0 | excellent | 2.76 | 3.16 |
|   |   |   | 93.0 | 5.0 | favorable | 2.51 | 3.49 |
|   |   |   | 88.0 | 10.0 | favorable | 2.33 | 4.00 |
|   |   |   | 83.0 | 15.0 | moderate | 2.00 | 4.23 |
|   |   | more than 5 μm | 98.0 | 0 | excellent | 1.79 | 3.00 |
|   |   |   | 97.0 | 1.0 | excellent | 1.74 | 3.08 |
|   |   |   | 96.5 | 1.5 | excellent | 1.68 | 3.15 |
|   |   |   | 96.0 | 2.0 | excellent | 1.91 | 3.33 |
|   |   |   | 93.0 | 5.0 | favorable | 2.14 | 4.08 |
|   |   |   | 88.0 | 10.0 | moderate | 2.11 | 4.59 |
|   |   |   | 83.0 | 15.0 | moderate | 1.58 | 5.66 |

As a result, in the case of using the MnO₂ powder with the particle size of at least 5 μm, the addition amount of MnO₂ had to be increased in order to attain a high adhesion strength, which led to the increase in the sheet resistivity. Further, in the case of adding MnO₂ under the conditions where the sheet resistivity is kept low, the adhesion strength was insufficient. While on the other hand, the paste prepared by pulverizing and classifying the MnO₂ particles to at most 5 μm size had a high adhesion strength and showed high performance excellent both in the sheet resistivity and the solderability by a smaller amount of addition. From the foregoings, it is apparent that extremely important factors for the preparation of the paste are to prepare the CuO powder of a particle size within a range from 1 to 9 μm and the MnO₂ powder of a particle size within a range of at most 5 μm for preparing the CuO paste.

What is claimed is:

1. A thick film conductor composition comprising an inorganic ingredient and an organic vehicle, wherein said inorganic ingredient comprises 80–98 wt% of copper oxide, and 2–20 wt% of at least one metal selected from the group consisting of Pt, Pd and Ni which metals are capable of forming a homogeneous solid solution with copper.

2. A thick film conductor composition as defined in claim 1, wherein the copper oxide is CuO.

3. A thick film conductor composition as defined in claim 1, wherein at least 95 wt% of the copper oxide powder is included within a range of particle size from 1 μm to 9 μm.

4. A thick film conductor composition comprising an inorganic ingredient and an organic vehicle, wherein said inorganic ingredient comprises a 70–97 wt% of copper oxide, 2–20 wt% of at least one metal selected from the group consisting of Pt, Pd and Ni, which metals are capable of forming a homogeneous solid solution with copper, and a 1–10 wt% of a heat resistant insulation material made of at least one material selected from the group consisting of ceramics and glass.

5. A thick film conductor composition as defined in claim 4, wherein the heat resistant insulation material comprises an ingredient selected from BaO, B₂O₃, CaO, MgO, Al₂O₃ and SiO₂ in the form of oxides.

6. A thick film conductor composition as defined in claim 1, wherein at least 95 wt% of the copper oxide powder is included within a range of particle size from 1 to 9 μm.

7. A thick film conductor composition comprising an inorganic ingredient and an organic vehicle, wherein said inorganic ingredient comprises 70–97 wt% of copper oxide, 2–20 wt% of at least one metal selected from the group consisting of Pt, Pd and Ni, which metals are capable of forming a homogeneous solid solution with copper, and a 1–10 wt% of manganese oxide.

8. A thick film conductor composition as defined in claim 7, wherein the metal capable of forming the homogenous solid solution with copper comprises at least one of Pt, Pd and Ni.

9. A thick film conductor composition as defined in claim 7, wherein the manganese oxide is MnO₂.

10. A thick film conductor composition as defined in claim 7, wherein at least 95 wt% of the copper oxide powder is included within a range of particle size from 1 to 9 μm, and at least 95 wt% of the manganses oxide has a particle size of at most 5 μm.

11. A thick film conductor composition comprising an inorganic ingredient and an organic vehicle, wherein said inorganic ingredient comprises 60–96 wt% of copper oxide, 2–20 wt% of at least one metal selected from the group consisting of Pt, Pd and Ni, which metals are capable of forming homogeneous solid solution with copper, 1–10 wt% of a heat resistant insulation material made of at least one material selected from the group consisting of ceramics and glass, and a 1–10 wt% of manganese oxide.

12. A thick film conductor composition as defined in claim 11, wherein the heat resistant insulating material comprises an ingredient selected from the group consisting of BaO, B₂O₃, CaO, MgO, Al₂O₃ and SiO₂ in the form of oxides.

13. A thick film conductor composition as defined in claim 11, wherein the manganese oxide is MnO₂.

* * * * *